United States Patent [19]
Forsman

[11] Patent Number: 5,797,275
[45] Date of Patent: Aug. 25, 1998

[54] AIR-COOLING SYSTEM

[75] Inventor: Bertil S. Forsman, Huddinge, Sweden

[73] Assignee: Telefonaktiebolaget LM Ericsson, Stockholm, Sweden

[21] Appl. No.: 656,337

[22] PCT Filed: Dec. 19, 1994

[86] PCT No.: PCT/SE94/01222

§ 371 Date: Jun. 13, 1996

§ 102(e) Date: Jun. 13, 1996

[87] PCT Pub. No.: WO95/17636

PCT Pub. Date: Jun. 29, 1995

[30] Foreign Application Priority Data

Dec. 22, 1993 [SE] Sweden .................. 9304266-1

[51] Int. Cl.⁶ .................. F25B 7/00; F25B 25/00
[52] U.S. Cl. .................. 62/175; 62/332
[58] Field of Search .................. 62/332, 99, 118, 62/175

[56] References Cited

FOREIGN PATENT DOCUMENTS

| | | |
|---|---|---|
| 0025665 | 3/1981 | European Pat. Off. . |
| 0304189 | 2/1989 | European Pat. Off. . |
| 3814238 | 7/1991 | Germany . |
| 0015033 | 1/1986 | Japan .................. 62/332 |
| 1062736 | 3/1986 | Japan .................. 62/99 |
| 8405560-7 | 6/1986 | Sweden . |
| 2134645 | 8/1984 | United Kingdom . |
| 2218499 | 11/1989 | United Kingdom . |

*Primary Examiner*—William Wayner
*Attorney, Agent, or Firm*—Burns, Doane, Swecker & Mathis, L.L.P.

[57] ABSTRACT

A cooling system of compact design includes redundancy and free cold source usage. The system includes two circuits for circulating coolant and heat absorbing medium, and two heat exchanges common to the circuits. The heat exchangers are combined to act on both of the circuits, so that inside air is cooled by cold liquid or by expanding coolant in a combined evaporator-air cooler, and the outside air is used to cool warmed liquid or condensed coolant in a combined condenser-liquid cooler. Free cold, that is, outside cold air, may be utilized when the difference in temperature between inside air and outside air is sufficiently great and the outside air is sufficiently cold. Liquid cooled by outside air in the combined condenser-liquid cooler and then heated by warm inside air in the combined evaporator-air cooler can satisfy the entire heat load. In other cases, the compressor system can provide cooling. The free-cooling system can serve as a redundant system for the compressor system.

4 Claims, 1 Drawing Sheet

AIR-COOLING SYSTEM

TECHNICAL FIELD

The present invention relates to a cooling system for cooling air, such as indoor air, wherein the cooled air can be used for cooling telecommunications equipment for instance, and wherein the air is used to carry away thermal energy.

DESCRIPTION OF THE BACKGROUND ART

Various thermal energy dissipating systems are known to the art in which air is used as a heat transporting medium. A feature which is common to one group of systems is that air is treated, i.e. cooled, and then recirculated in the room to be cooled or in the room in which a particular item is to be cooled. Thus, a room in which telecommunications equipment is installed can be cooled in several different ways. For instance, the indoor air, or room air, can be cooled with the aid of a compressor cooling system or with the aid of a cold liquid. A common feature of both these methods is that the heat exchangers used to effect heat transfer between coolant and air and between liquid and air respectively have similar constructions.

Free cold is used in order to keep operating costs as low as possible. By free cold is meant essentially that when outdoor temperatures are low, the air is used directly in this state for cooling purposes, instead of operating an energy-demanding cooling system, such as a compressor cooling system, for instance. The use of free cold can save considerable quantities of energy. In one method of cooling with cold air, liquid is circulated and cooled by the cold outdoor air and then used to cool the room air. This method is efficient up to a given outdoor temperature, whereafter the air must be cooled with the aid of some other means, for instance with the aid of a compressor cooling system. A free-cold cooling system could well be used as a backup system for a compressor cooling system and brought into use should the compressor cooling system malfunction for some reason. In cases such as these, the free cooling system is referred to as a redundancy for the compressor cooling system.

SUMMARY OF THE INVENTION

With the intention of obtaining a cooling system of compact design which can be embodied in one single unit with redundancy and free cold, the heat exchangers of the cooling system have been combined so that the room air is cooled in the cooling system by means of cold liquid or by means of a boiling coolant in a combined evaporator-air cooler, and the outdoor air cools warm liquid or condensing coolant in a combined condenser-liquid cooler. Free cold may be utilized when the difference in temperature between indoor air, or room air, and outdoor air is sufficiently large and the outdoor air is sufficiently cold. Liquid that is cooled by the outside air in the combined condenser-liquid cooler (EC) and then heated by the room air in the combined evaporator air-cooler (cc) is then capable of handling the entire heat load alone. In other instances, the air can be cooled with the aid of the compressor cooling system.

The free-cold cooling system shall also be capable of functioning as a redundancy for the compressor system should said system fail. For instance, in the event of a power cut the system fans and liquid pump may be operated on batteries, via a rectifier or some like device. At the end of the power cut, the compressor cooling system can be restarted and the batteries recharged. It is also feasible to run both systems simultaneously under certain circumstances, so as to obtain an increased cooling effect.

DETAILED DESCRIPTION

Figure 1:
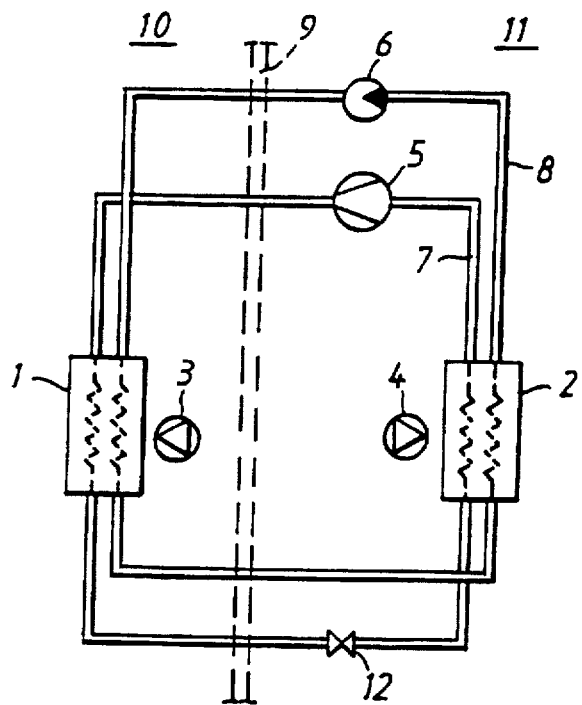
FIG. 1 illustrates a cooling system for cooling indoor air in accordance with the invention.

FIG. 1 illustrates schematically the main components of a cooling system, which may be incorporated in a single unit, for example in telecommunications equipment, having a combined condenser-liquid cooler 1 (EC) and a combined evaporator-air cooler 2 (CC). The Figure also shows how these components are mutually connected. The combined condenser liquid cooler 1 is either placed outdoors, as indicated at 10, or is installed in an external wall 9, and the combined evaporator-air cooler 2 is installed indoors, as indicated at 11, and functions as a heat exchanger in coaction with each of two separate pipe systems, of which one pipe system 8 conveys liquid and the other pipe system 7 conveys a coolant. As indicated, there may be provided between the outdoor space 10 and the indoor space 11 a partition wall 9 in which the cooling system can be placed in the form of a unit. Seen in the direction of flow, the coolant circuit 7 includes a compressor 5 downstream of the evaporator air cooler 2 and an expansion valve 12 downstream of the condenser-liquid cooler 1. The liquid circuit 8 includes a liquid pump 6. A condenser fan 3 is connected to the combined condenser-liquid cooler 1. An evaporator fan 4 is connected to the combined evaporator-air cooler 2.

The compressor cooling system is said to constitute the main cooling system of the aforesaid room air cooling system, and hence it can be said in summary that the present invention provides a system for obtaining free cold at outdoor temperatures which enables this and a redundancy function which can be used in the event of a failure in the main cooling system. The evaporator and condenser of the main cooling system thus include an extra liquid piping system which is arranged in parallel with the main system and which is intended for use in low outdoor temperatures, as before mentioned, and which will function to cool the air inside an apparatus room, for instance, should the main system fail. The two parallel systems may utilize common heat exchanging surfaces for heat exchange with the air. Because the same evaporator fan and the same condenser fan are used in all operational instances, it is possible to save considerable space and costs in comparison with other free-cooling and redundancy systems, and the combined system can be constructed as one single compact unit.

Figure 2:
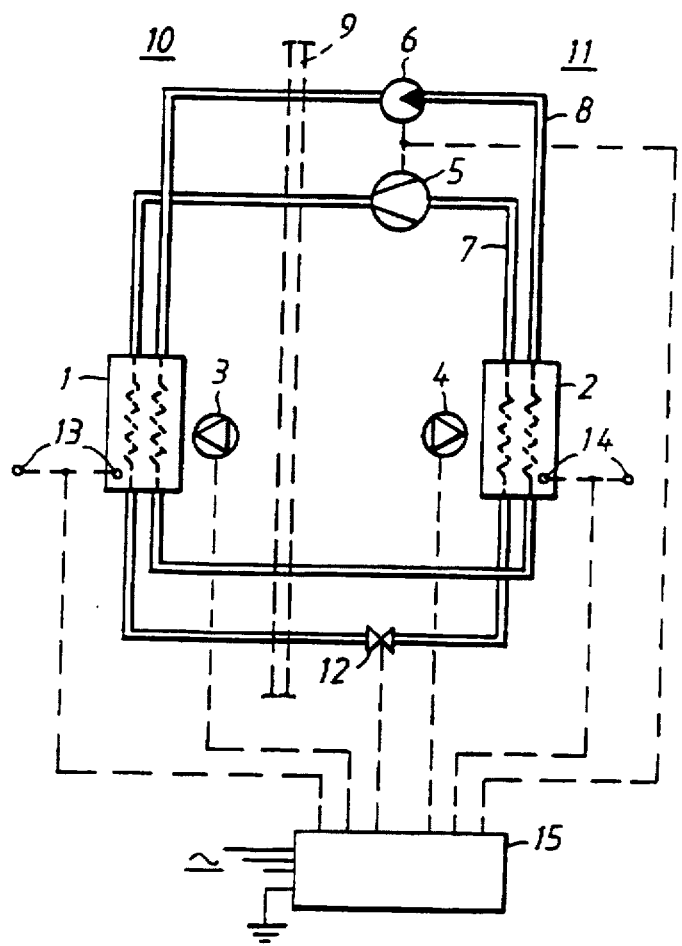
FIG. 2 illustrates an inventive cooling-controlling and monitoring system.

FIG. 2 is a greatly simplified illustration of a cooling-system controlling and monitoring system. The outdoor temperature and indoor temperature are registered with the aid of temperature, sensors 13 and 14, and optionally also the level of temperature in the combined condenser-liquid cooler 1 and the combined evaporator-air cooler 2 respectively. The illustrated system also includes a control unit 15 which receives measurement signals from the various parts of the system and also from the temperature sensors. These measurement signals are processed and stored in the control unit and may, for instance, be compared with reference values, such as set-point values, which are either calculated or stored, and delivers control signals to the various parts of the system for optimal operation of the cooling system.

Measurement signals and or control signals are indicated by broken lines in the Figure. In the event of a power cut, running of the cooling system can be kept running with the aid of the battery function of the control unit subsequent to making adjustments to the system through the medium of control signals.

I claim:

1. A cooling system for cooling an indoor space comprising:

- a first heat exchanger located outside an indoor space including a combined condenser for a coolant and cooler for a heat absorbing medium, wherein the first heat exchanger emits heat to the ambient air;
- a second heat exchanger located within the indoor space including a combined evaporator for the coolant and cooler for the heat absorbing medium, wherein the coolant and heat absorbing medium extract heat from air in the indoor space;
- a first circuit to circulate the coolant connected to the condenser of the first heat exchanger and the evaporator of the second heat exchanger;
- a compressor connected in the first circuit to compress the coolant flowing from the second heat exchanger to the first heat exchanger;
- an expansion valve connected in the first circuit to expand cooled coolant flowing from the first heat exchanger to the second heat exchanger;
- a second circuit to circulate the heat absorbing medium connected to the cooler of the first heat exchanger and the cooler of the second heat exchanger;
- a pump connected in the second circuit to circulate the heat absorbing medium between the first heat exchanger and the second heat exchanger;
- temperature sensors positioned for measuring temperature in the indoor space and outside the indoor space; and
- a control unit connected for monitoring said temperature sensors and controlling the compressor and the pump, wherein responsive to received temperature signals the control unit activates at least one of the compressor and the the pump to cool the indoor space.

2. A cooling system according to claim 1, further comprising fans for forcing air over the heat exchangers.

3. The cooling system according to claim 1, wherein the control unit includes means for storing reference temperature values and comparing the stored values to measured temperature values received from the sensors, and wherein the control unit is configured to activate the pump if the measured temperature outside the indoor space is below the measured temperature of the indoor space and below a stored reference value.

4. The cooling system according to claim 1, further comprising a battery backup power system, wherein the control unit includes means for activating the pump to run on battery power if a power supply failure occurs.

* * * * *